US008856710B2

(12) United States Patent
Yeh et al.

(10) Patent No.: US 8,856,710 B2
(45) Date of Patent: Oct. 7, 2014

(54) TOOL AND METHOD FOR MODELING INTERPOSER RC COUPLINGS

(75) Inventors: Chao-Yang Yeh, Luzhou (TW); Ze-Ming Wu, Tainan (TW); Meng-Lin Chung, Taipei (TW); Chih-Chia Chen, Taipei (TW); Li-Fu Ding, Hsinchu (TW); Sa-Lly Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 298 days.

(21) Appl. No.: 13/172,248

(22) Filed: Jun. 29, 2011

(65) Prior Publication Data
US 2013/0007692 A1 Jan. 3, 2013

(51) Int. Cl.
*G06F 17/50* (2006.01)

(52) U.S. Cl.
CPC .................................. *G06F 17/5036* (2013.01)
USPC ........... 716/115; 716/110; 716/111; 716/113; 716/136

(58) Field of Classification Search
USPC ........................................................ 716/115
See application file for complete search history.

(56) References Cited

U.S. PATENT DOCUMENTS

| 6,721,929 | B2 | 4/2004 | Li |
| 6,725,185 | B2 * | 4/2004 | Clement .......................... 703/14 |
| 7,082,587 | B2 | 7/2006 | Chen |
| 2001/0029601 | A1* | 10/2001 | Kimura et al. .................. 716/19 |
| 2002/0021135 | A1 | 2/2002 | Li |
| 2003/0208346 | A1 | 11/2003 | Huang |
| 2010/0199236 | A1* | 8/2010 | Chen et al. ........................ 716/3 |
| 2010/0257495 | A1 | 10/2010 | Wu |
| 2012/0319248 | A1* | 12/2012 | Rahman ......................... 257/621 |

OTHER PUBLICATIONS

Hao Ji et al., RC Extraction and Timing Analysis with On-Chip Random Variations, Cadence Design Systems, Inc., 7 pages, Session No. 7.3, at http://www.cdnusers.org/Portals/0/cdnlive/na2006/7.3/7.3_paper.pdf.
Krishnakumar Sundaresan, StarRC Custom: Next-Generation Modeling and Extraction Solution for Custom IC Designs, May 2010, Synopsys Predictable Success, pp. 1-6.
Sangwook Han et al., Performance Improvement of Resonant Inductive Coupling for Wireless 3D IC Interconnect; EECS Dept. Univ. of Michigan, Ann Arbor, MI, 2010 IEEE Jul. 11-17, 2010, pp. 1-4.

(Continued)

*Primary Examiner* — Jack Chiang
*Assistant Examiner* — Eric Lee
(74) *Attorney, Agent, or Firm* — Duane Morris LLP; Steven E. Koffs

(57) ABSTRACT

A method comprises analyzing front side conductive patterns and back side conductive patterns on a semiconductor interposer using a machine implemented RC extraction tool, and outputting data representing a plurality of respective RC nodes from the RC extraction tool to a tangible persistent machine readable storage medium. A substrate mesh model of the semiconductor interposer is generated, having a plurality of substrate mesh nodes. Each substrate mesh node is connected to adjacent ones of the plurality of substrate mesh nodes by respective substrate impedance elements. A set of inputs to a timing analysis tool is formed. The plurality of RC nodes are connected to ones of the plurality of substrate mesh nodes of the substrate mesh model. The set of inputs is stored in a tangible machine readable storage medium.

20 Claims, 14 Drawing Sheets

(56) References Cited

OTHER PUBLICATIONS

Yoon, K. et al., "Modeling and Analysis of Coupling between TSVs, Metal, and RDL interconnects in TSV-basaed 3D IC with Silicon Interposer", 2009 11th Electronics Packaging Technology Conference, pp. 702-706.

Bermond, C., et al, "High Frequency Characterization and Modeling of High Density TSV in 3D Integrated Circuits", IEEE Workshop on Signal Propagation on Interconnects, SPI 2009, pp. 1-4.

* cited by examiner

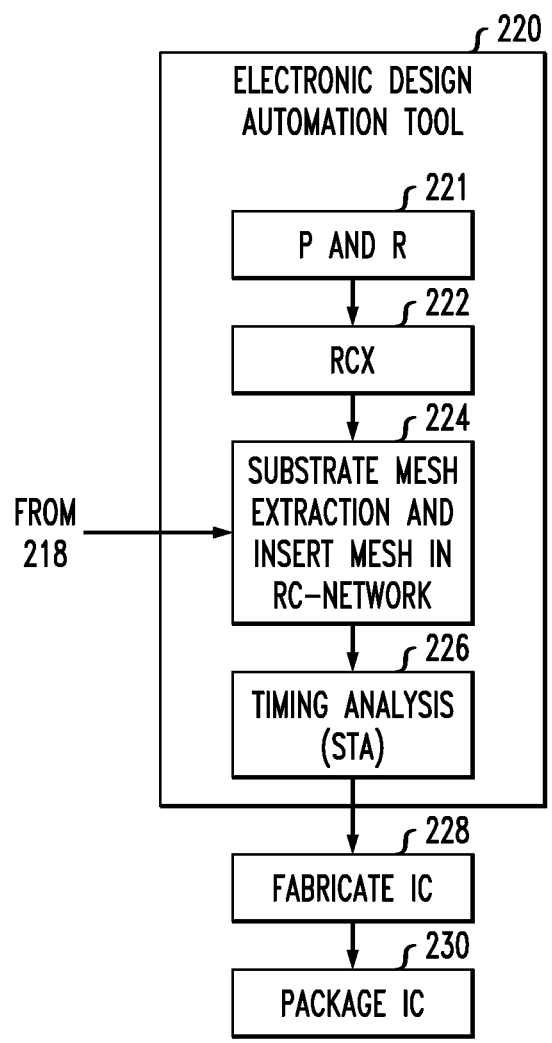

TOOL AND METHOD FOR MODELING INTERPOSER RC COUPLINGS

FIELD

The disclosed subject matter relates to modeling and simulation tools for integrated circuits.

BACKGROUND

Integrated circuits ("ICs") are incorporated into many electronic devices. IC packaging has evolved, such that multiple ICs may be vertically stacked in so-called three-dimensional ("3D") packages in order to save horizontal area on a printed circuit board ("PCB"). An alternative packaging technique, referred to as a 2.5D package may use an interposer, which may be formed from a semiconductor material such as silicon, for coupling one or more dies to a PCB. A plurality of IC chips, which may be of heterogeneous technologies, are mounted on the interposer. Connections among the various ICs are routed through conductive patterns in the interposer. Interposers affect the operating characteristics of the ICs that are bonded or otherwise coupled to the interposer due to the resistance and capacitance ("RC") of the semiconductor substrate.

BRIEF DESCRIPTION OF THE DRAWINGS

FIGS. 2A-2B show a system and process for simulating frequency dependent effects in an interposer.

DETAILED DESCRIPTION

Figure 1:
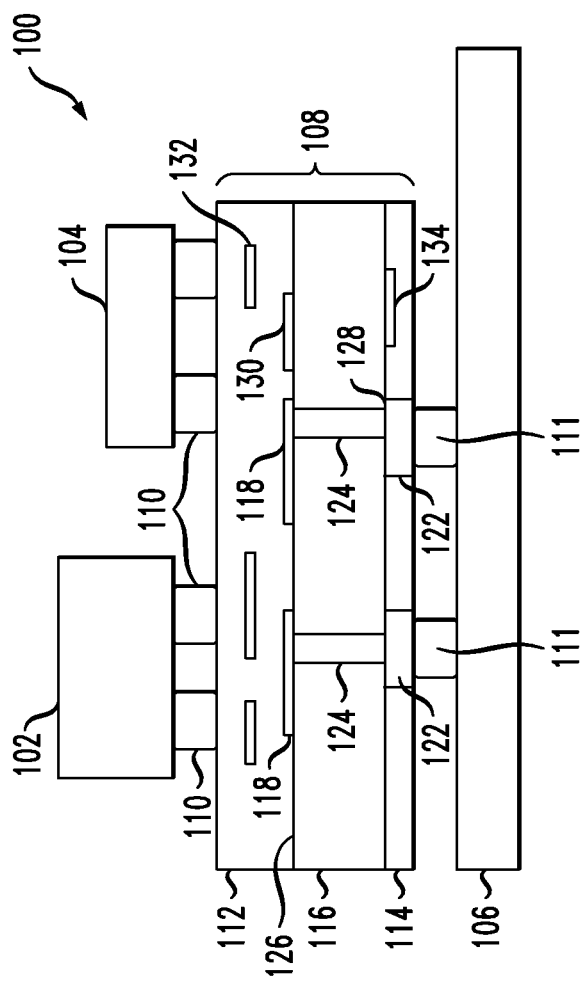
FIG. 1 is a diagram of a system including a semiconductor interposer.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

A tool and method are provided for modeling and simulating the frequency dependent capacitive couplings of the semiconductor interposer during the design stage.

For example, FIG. 1 illustrates one example of a 2.5-dimensional ("2.5D") integrated circuit ("IC") package 100 in which first and second IC chips 102, 104 are coupled to an interposer 108, which is in turn mounted on a printed circuit board ("PCB") 106. IC chips 102, 104 may be bonded to interposer 108 using small conductive bumps 110, which may be referred to as a "microbump" or "g-bump". Conductive bumps 111 may also be used to couple interposer 108 to PCB 106. Microbumps 110 connecting the IC chips 102, 104 to interposer 108 may have different sizes and electrical properties than the bumps 111 connecting the interposer 108 to PCB 106.

Interposer 108 includes a semiconductor substrate 116 having front-side and back-side interconnect layers 112, 114 formed on its front and back major surfaces, respectively. In some applications, substrate 116 is not grounded and thus is electrically floating. Front- and back-side interconnect layers 112, 114 each may comprise a plurality of inter-metal dielectric (IMD) layers, which include via level layers (V1, V2, etc.) and metal line level layers (e.g., M1, M2, etc.). As shown in FIG. 1, front-side interconnect structure 112 may include conductors 118, 130 disposed in a first metal layer (i.e., M1) and a conductor 132 disposed in a second metal layer (i.e., M2). Conductor 118 in front-side interconnect layer 112 may be electrically connected to metal conductor 122 in back-side interconnect layer 114 by way of a through-silicon via ("TSV") 124 that extends from front-side surface 126 of semiconductor substrate 116 to rear-side surface 128 of semiconductor substrate 116.

Front- and back-side interconnect layers 112, 114 may also include conductors 130, 132, 134 that are not connected to each other. Although front and rear conductors 130, 132, 134 are not conductively connected to each other, electrical coupling (i.e., capacitive and/or inductive coupling) between conductors 130, 132, and 134 occurs during operation of 2.5D IC 100. Electrical coupling also can occur between conductors in the same side of semiconductor substrate 116. For example, electrical coupling may occur between conductor 118 and 130, even if there is no conductive connection between them. Coupling may also occur between adjacent TSVs 124 that extend through semiconductor substrate 116. The electrical coupling between conductors in the interposer degrades the performance of the 2.5D IC. Typical RC extraction tools and simulation software based on the outputs of such RC extraction tools do not model the frequency dependent effects of such capacitive or inductive couplings. Thus, the interposer of 2.5D ICs designed using such tools thus have different frequency dependent characteristics than is intended during the design and simulation phase.

Figure 2A:
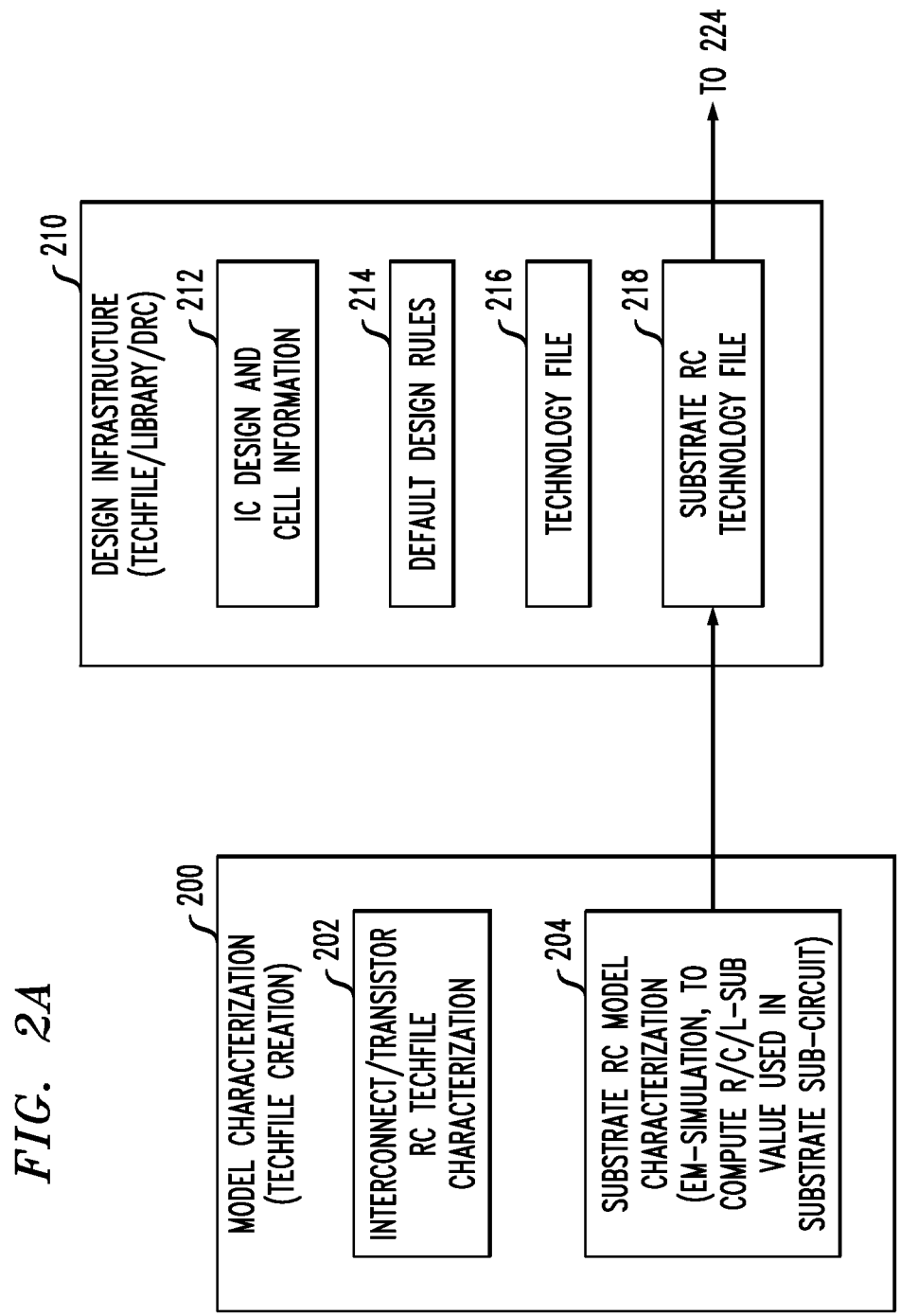

FIGS. 2A and 2B provide a high level flow chart of a timing analysis method.

FIG. 2A shows the steps performed for model characterization (techfile creation) 200 and the design infrastructure (techfile/library and design rule check) 210.

At block 202, the interconnect/transistor RC techfile characterization is performed. Thus, the model accounts for the active device layers and BEOL interconnect layers of the dies 102, 104.

At block 204, the substrate RC (or RLC) model is characterized for the interposer 108. This includes EM simulation, to compute R, C and L values to be used in the substrate sub circuit model to represent the substrate. These R, L and C values are selected to match silicon test data taken at several different frequencies in the relevant frequency band with good correlation, as described below. The R, L and C values in this step are based on a substrate region of unit dimensions (e.g., 1 µm×1 µm). These values can then be made available for modeling substrates of any size.

At block 212, the IC designs of dies 102, 104 and cell information is stored in a tangible storage medium for use in modeling and fabricating an IC.

At block 214, a set of default design rules 214 are provided for use by the place and route tool.

At block 216, a technology file defines the material and geometry relationships for the particular technology node being used in the dies 102, 104.

At block 218, a substrate RC techfile is provided based on the substrate characterization model 204. This file may be in the form of the circuit elements shown in any of FIGS. 6A-6D, for example. This RC technology file may be included as part of the original RC technology file and used during step 224 (below).

FIG. 2B shows the design and fabrication process adapted to include the interposer substrate model.

At block 221, the place and route tool determines the locations of cells and the routing of conductive lines and vias to form a preliminary layout.

Figure 3:
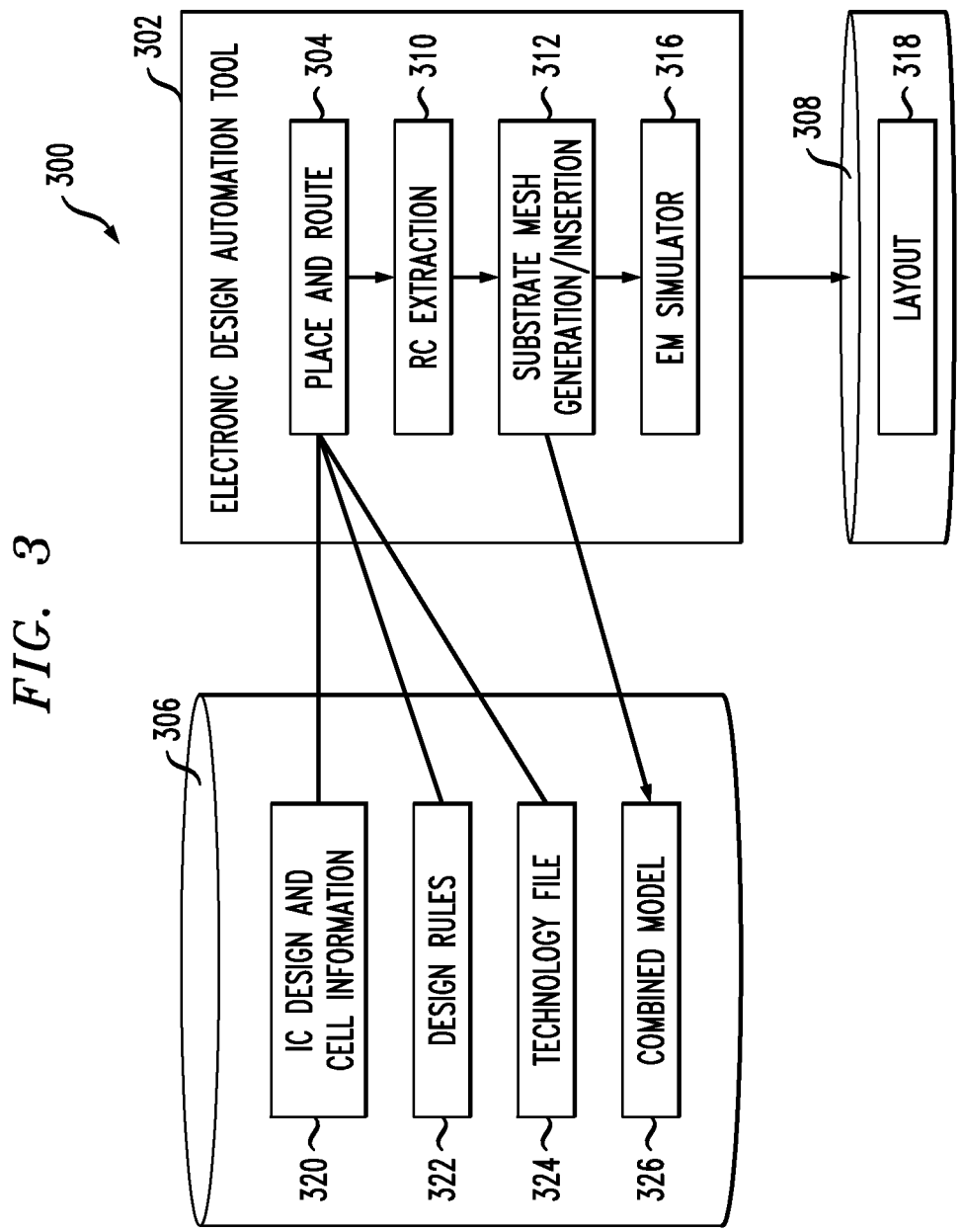
FIG. 3 is a block diagram of a system for designing and analyzing an IC product.
Figure 4A:
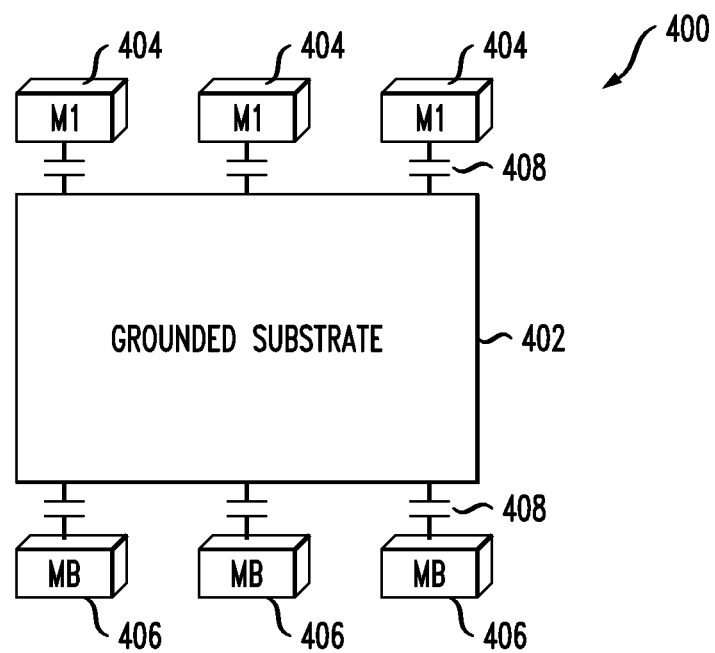
FIG. 4A is a schematic diagram of a grounded substrate model generated by an RC extraction tool.

At step 222 design RC extraction is performed for an IC design which includes a semiconductor interposer 108. For purpose of RC extraction, the interposer model 400 used by the RC extraction tool treats the floating substrate 116 as a grounded substrate 402 (as shown in FIG. 4A). The machine implemented RC extraction tool 310 (FIG. 3) analyzes the front side conductive patterns 118, 130, 132 (modeled by front side elements 404) and back side conductive patterns 122, 134 (modeled by backside elements 406) on the grounded substrate model of the semiconductor interposer 402. The RC model 400 assumes respective capacitive elements 408 between ground and the conductive patterns 404, 406 on the interposer 402. RC extraction tool 310 outputs data representing a plurality of respective RC nodes 404, 406 to a tangible persistent machine readable storage medium 306 (FIG. 3).

Referring again to FIG. 2, at step 224, a substrate mesh model 410 (FIG. 4B) of the semiconductor interposer is generated having a plurality of substrate mesh nodes 414. The unit dimension values from block 204 are scaled based on the actual dimensions of the interposer substrate. Alternatively, in some embodiments, the grid size can be adjusted to a unit dimension if the model is small enough to run quickly on the computer platform used. Each substrate mesh node 414 is connected to adjacent ones of the plurality of substrate mesh nodes by respective substrate impedance elements 412. In some embodiments, the nodes 414 lie along a rectangular grid having orthogonal major axes X, Y and Z (FIG. 5) aligned with the axes of the substrate. The substrate impedance elements are arranged on the sides of the rectangles defining the grid. Then a set of inputs to a timing analysis tool is formed from the grounded substrate RC extraction model and the substrate mesh model. The plurality of RC nodes (FIG. 4A) are connected to ones of the plurality of substrate mesh nodes (FIG. 4B) of the substrate mesh model. The set of inputs is stored in a persistent, tangible machine readable storage medium 326 (FIG. 3).

At step 226, a timing analysis of the semiconductor interposer is performed using a machine implemented timing analysis tool 316 and the set of inputs, so as to simulate frequency dependent capacitive couplings between the front side conductive patterns and backside conductive patterns.

At step 228, if the timing analysis indicates that a design of the semiconductor interposer satisfies a predetermined timing specification, the semiconductor interposer can be fabricated.

At step 230, the semiconductor interposer is incorporated into a 2.5D package.

FIG. 3 is a block diagram of a system for modeling a semiconductor interposer, according to one embodiment. System 300 includes an electronic design automation ("EDA") tool 302 such as "IC COMPILER"™, sold by Synopsis, Inc. of Mountain View, Calif., which may include a place and route tool 304, such as "ZROUTE"™, also sold by Synopsis. Other EDA tools 302 may be used, such as the "VIRTUOSO" custom design platform or the Cadence "ENCOUNTER"® digital IC design platform may be used, along with the "VIRTUOSO" chip assembly router 304, all sold by Cadence Design Systems, Inc. of San Jose, Calif.

EDA tool 302 is a special purpose computer formed by retrieving stored program instructions from a non-transient computer readable storage medium 306, 308 and executing the instructions on a general purpose processor (not shown). Examples of non-transient computer readable storage mediums 306, 308 include, but are not limited to, read only memories ("ROMs"), random access memories ("RAMs"), flash memories, or the like. Tangible, non-transient machine readable storage mediums 306, 308 are configured to store data generated by the place and route tool 304.

Router 304 is capable of receiving an identification of a plurality of cells to be included in an integrated circuit ("IC") or interposer layout, including a list 320 of pairs of cells within the plurality of cells to be connected to each other. Router 304 may be equipped with a set of default design rules 322 and tech file 324. In addition, an RC tech file 326 developed by process 200 (shown in FIG. 2) provides parameters for a floating interposer 108. As described below, these physical parameters are based on a frequency-dependent circuit model that approximates the semiconductor's response to an electromagnetic wave.

EDA tool 302 also includes an RC extraction tool 310, as well as an electromagnetic ("EM") simulation tool 316. (EM tool is used during characterization, and not in implementation. The resulting RC-netlist is feed-in to STA tool.) RC extraction tool 310 is configured to perform RC timing analysis of the circuit patterns of interposer 108 such that the RC timing analysis is performed based on the layout of the metal patterns 118, 130, 132, 134 in the interconnect layers 112, 114, using a grounded substrate model. In some embodiments, the RC extraction output file is in Standard Parasitic Format (SPF). In other embodiments, the RC extraction output file is in another format, such as Detailed Standard Parasitic Format (DSPF), Reduced Standard Parasitic Format (RSPF), Standard Parasitic Exchange Format (SPEF), or Synopsys Binary Parasitic Format (SBPF).

A substrate mesh generation and insertion engine 312, as described below, is included. The substrate mesh generation and insertion engine 312 accepts as inputs the output file of the RC extraction engine 310. From this file, the location of the RC nodes is determined. A substrate mesh model is generated, and combined with the RC node model output by the RC extraction engine as described below. The combined model is then output in the same format as the RC extraction engine (or the same format used by EM Simulator 316).

Referring again to FIG. 3, the 316 (STA simulator) receives the combined model and performs a simulation, which can now account for the frequency dependent characteristics of the interposer substrate.

Figure 4B:
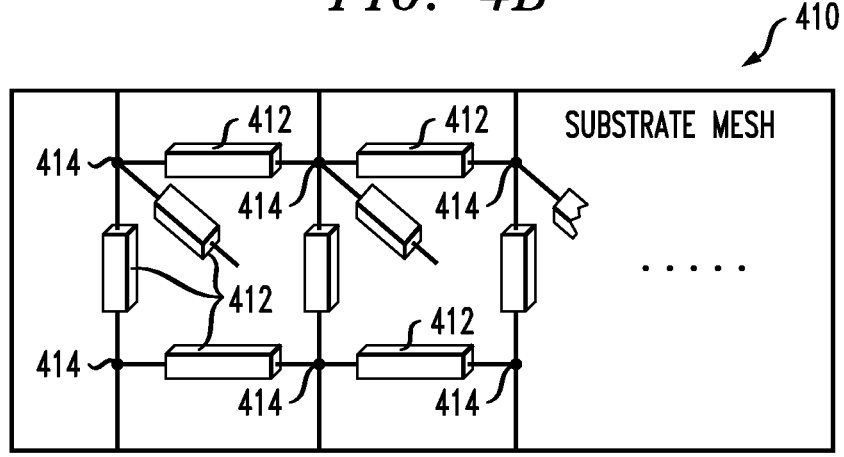
FIG. 4B is a schematic diagram of a substrate mesh model.
Figure 5:
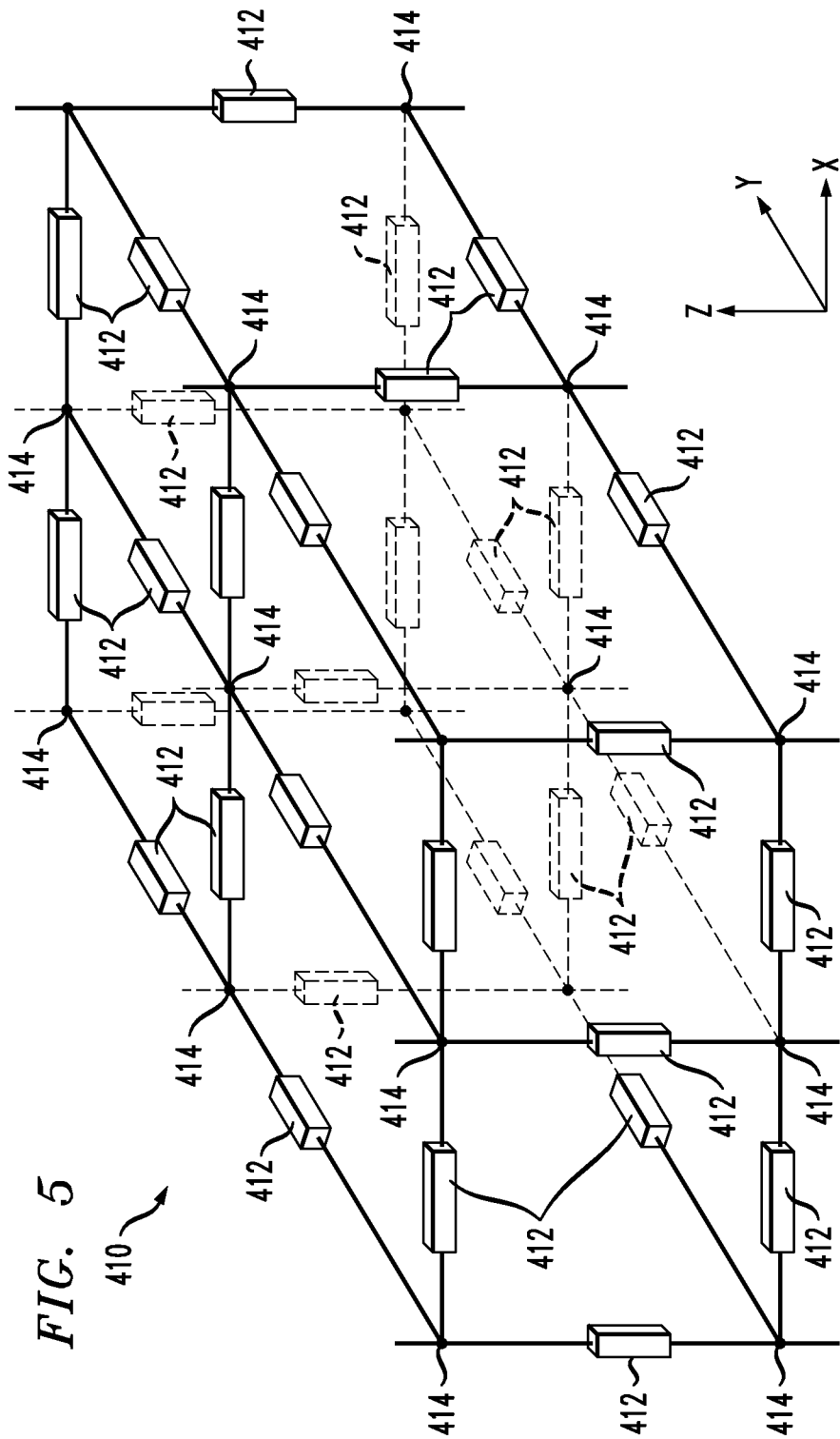
FIG. 5 is an isometric diagram of the substrate mesh model of FIG. 4B.

FIG. 5 is an isometric diagram of an embodiment of the substrate mesh model of FIG. 4B. FIG. 5 is an example of an evenly spaced mesh having regularly spaced nodes 414, connected by impedance elements 412. Because the interposer 108 does not have active devices, the impedance elements of the interposer 108 can be represented in the substrate mesh model with good accuracy as substrate elements and TSV elements. The nodes 414 and the substrate impedance elements 412 of the substrate mesh model 410 are arranged on a three-dimensional rectangular grid having three orthogonal axes, such that each substrate impedance element 412 is located between two adjacent ones of the nodes 414. The impedance elements 412 representing the substrate impedance may be any of the circuits 412a-412d shown in FIGS. 6A-6D, for example.

Figure 6A:
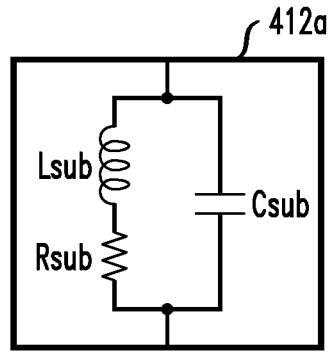
FIGS. 6A-6D are schematic diagrams of the impedance elements in FIG. 4B.

FIG. 6A shows a an impedance element 412a having a capacitor Csub in parallel with a path, where the path includes an inductor Lsub and a resistor Rsub connected in series.

Figure 6B:
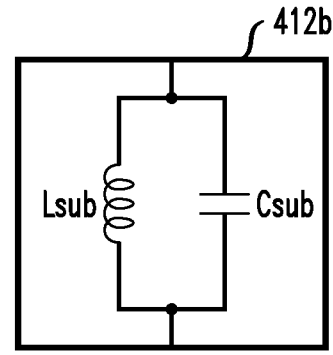

FIG. 6B shows a an impedance element 412b having a capacitor Csub in parallel with an inductor Lsub.

Figure 6C:
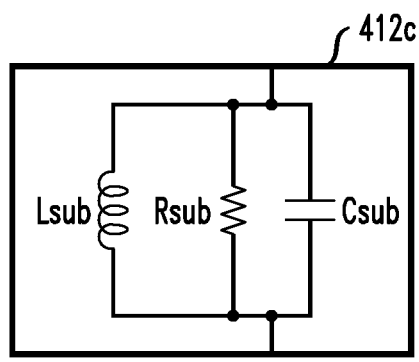

FIG. 6C shows a an impedance element 412c having a capacitor Csub, an inductor Lsub and a resistor Rsub in three parallel paths.

Figure 6D:
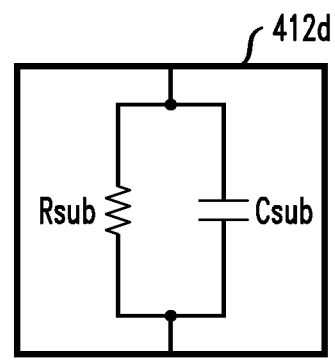

FIG. 6D shows a an impedance element 412d having a capacitor Csub in parallel with a resistor Rsub. In some embodiments, the elements 412d have a computational advantage, because of their compatibility with the RC nodes output by the RC extraction engine 310.

For simplicity, the impedance elements 412a-412d are generally referred to below as 412. For a regular grid with evenly spaced nodes, the multiplicity of impedance elements 412 have only a relatively small number of values. Thus, for example, impedance elements 412 connecting two interior nodes 414 of the substrate mesh may all have the same values of Csub, Rsub and Lsub. If the grid mesh is not regular, these RLC values are re-computed. During substrate characterization a RC or RLC-model is developed based on unit-dimension (e.g., 1 μm×1 μm). During substrate mesh creation, the real value for an interposer having a particular geometry is computed by scaling the RC or RLC-value based on the real dimensions of the interposer. The scaling is based on the ratio of dimensions used in the actual design and in characterization. Thus, if each cell of the interposer model will be 2 μm×2 μm, scaled values for Rsub and Csub may be one half the values of the unit dimension impedance element.

Referring again to FIG. 5, in some embodiments, where the RC extraction engine generates RC nodes having a regular spacing, the substrate mesh model 410 is generated to have the same regular spacing. For example, the substrate mesh nodes 414 may have the same X-Y (in-plane) coordinates as the RC nodes, but different out-of-plane coordinates.

In other embodiments, the RC extraction engine generates RC nodes having a irregular spacing. For example, the density of RC nodes may be greater in areas of greater active device density, or in areas of greater metal conductor density. In such cases, the substrate mesh model may be generated to have the same irregular spacing as the RC nodes. For example, the substrate mesh nodes may have the same X-Y (in-plane) coordinates as the RC nodes, but different out-of-plane coordinates.

In other embodiments, the nodes of the substrate mesh model are not aligned with the RC nodes output by RC extraction engine 310. For example, the substrate mesh model can be configured so as to reduce simulation run time, based on the characteristics of the interposer substrate being modeled. An example is discussed below with respect to FIGS. 7 and 11, where substrate mesh nodes are placed at locations corresponding to interposer TSVs.

Figure 7A:
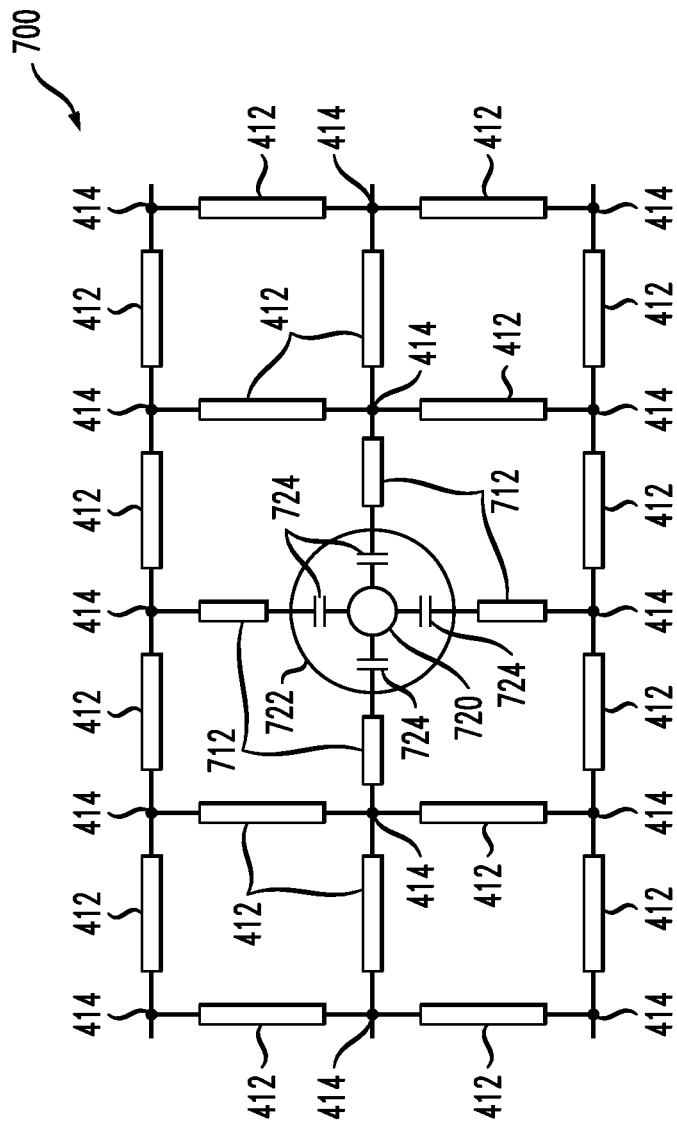
FIGS. 7A and 7B are schematic diagrams of a model of a through silicon via (TSV) aligned along the substrate mesh grid (FIG. 7A) or off the grid line (FIG. 7B).

FIG. 7A is a schematic diagram of a portion of a substrate mesh model 700 including a TSV 720. The substrate has at least one through-substrate via (TSV) extending from the front side of the substrate to the back side of the substrate. As shown in FIG. 7A, the grid size of the substrate mesh 700 may be selected so that the TSVs 720 are located along a grid line connecting the substrate mesh nodes 414. That is, the TSV 720 may be located at (or replaces) one of the grid nodes 414. The conductive (e.g., copper) material of TSV 720 and the liner (diffusion barrier) 722 surrounding the TSV 720 occupy space and thus reduce the volume of silicon substrate at the portion of the substrate mesh including the TSV 720. Thus, the four impedance elements 712 surrounding the TSV node 720 have smaller values of Csub, and Rsub than the impedance elements 412. If the model for impedance element 712 includes an inductance Lsub, the value of Lsub for elements 712 can differ from that used in elements 412. In some embodiments, the substrate mesh model 700 also includes capacitors 724 to represent the liner 722.

Figure 7B:
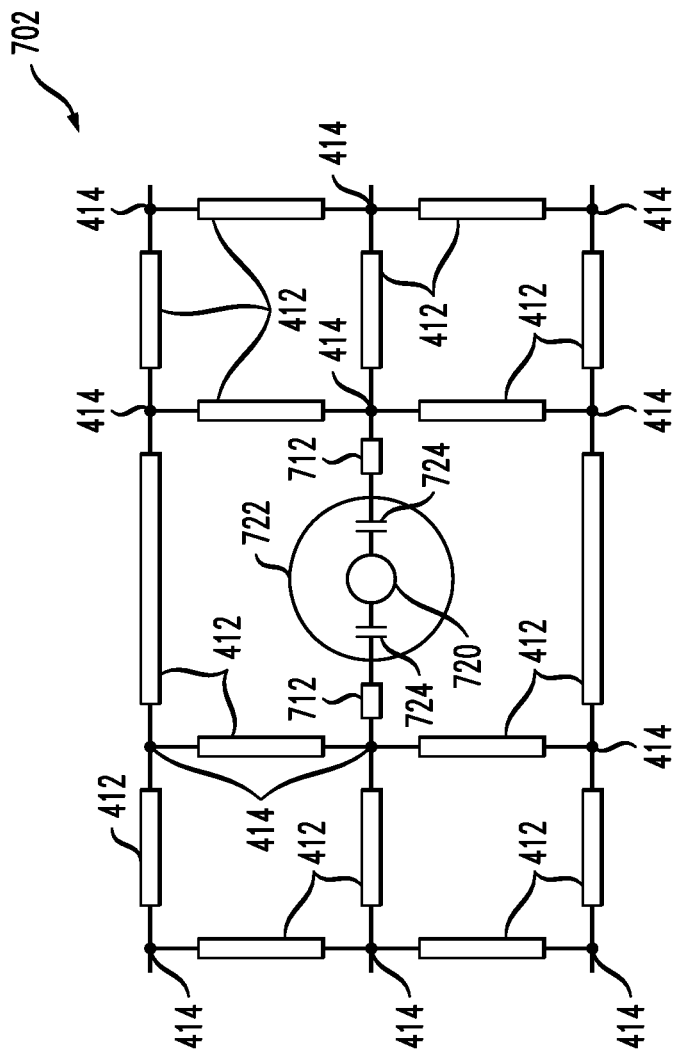

In other embodiments, the TSVs in the model are not located at the intersection of two grid lines. but may be in between grid lines, as shown in FIG. 7B. In the example, the substrate mesh 702 has TSV's located along a grid line, in between grid intersections. The impedance elements 712 connecting the TSV to adjacent nodes of the grid line along which it is located are adjusted accordingly.

In other embodiments (not shown), the TSVs may be located so as not to lie along any of the substrate mesh grid lines. This can be accommodated by inserting two or four additional nodes in the grid between the existing grid lines, so that the TSV lies along a segment connecting the added nodes.

Figure 8A:
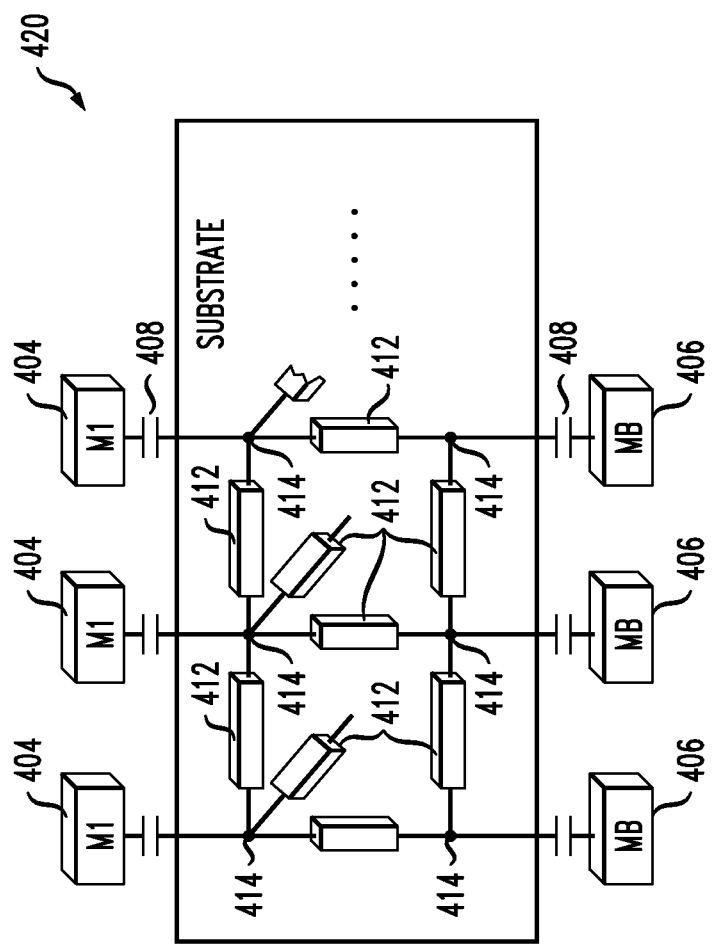
FIG. 8A is an example of a method of connecting the grounded substrate model of FIG. 4A to the substrate mesh model of FIG. 4B.

FIG. 8A is a schematic diagram showing the combination 420 of the grounded substrate model 400 (FIG. 4A) from the RC extraction engine 310 and the substrate mesh model 410 (FIG. 4B). The models 400, 410 are combined by joining the capacitors 408 of the grounded substrate model 400 to selected nodes 414 of the substrate mesh model 410. FIG. 8A further shows an example in which each of the RC nodes 404 has a respective corresponding node 414 of the substrate mesh model directly underlying the RC node 404, and each of the RC nodes 406 has a respective corresponding node 414 of the substrate mesh model directly above the RC node 406. Thus, there is a one-to-one correspondence between the RC nodes 404, 406 and the nodes 414 on the front and back faces of the substrate mesh model 410. The process of generating the substrate mesh model includes generating a respective substrate mesh node having the same in-plane (X-Y) coordinates as, and directly underlying, each respective RC node. The joining can be performed by way of a netlist. Thus, the netlist entries for RC extraction nodes corresponding to capacitors 408 (FIG. 4A) are modified to be connected to nodes 414 of the substrate mesh model (FIG. 4B), instead of ground.

Figure 8B:
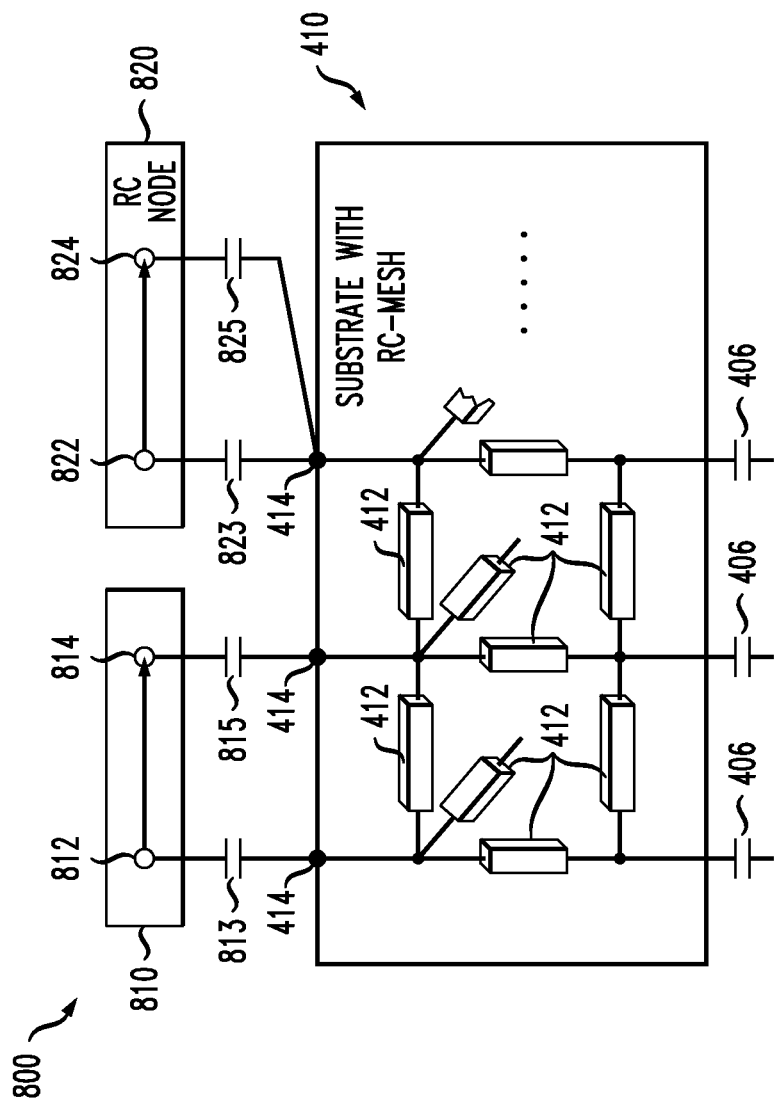
FIG. 8B shows a detail of connecting the grounded substrate model to a substrate mesh model having a different number of nodes.

FIG. 8B shows another example of a combined model 800 in which there is not a one-to-one correspondence between the RC nodes 812, 814, 822, 824 and the nodes 414 on the front and back faces of the substrate mesh model 410. In FIG. 8B, the RC extraction model 400 may include RC nodes 812 and 814 representing a first conductive pattern 810, and RC nodes 822 and 824 representing a second conductive pattern 820.

For some of the RC nodes 812, 814, the substrate mesh model 410 is generated to include a respective substrate mesh node 414 adjacent to each respective RC node 812, 814, and the step of forming the set of inputs to the simulator 316 includes connecting each RC node 812, 814 to its respective substrate mesh node 414. These substrate mesh nodes may be directly underlying (same X-Y in-plane coordinates), or offset from (different X-Y coordinates), their respective substrate mesh nodes. This allows the substrate mesh to be modeled with the same accuracy as the conductors 810, regardless of whether the X-Y coordinates of the corresponding nodes are the same. In the RC extraction netlist defining the model 400, the capacitor 813 (connected to node 812 of the RC extraction output) is modified so its bottom end is connected to one of the nodes 414 of the substrate mesh 410 directly underlying node 812. Similarly, the capacitor 815 (connected to node 814 of the RC extraction output) is modified so its bottom end is connected to one of the nodes 414 of the substrate mesh 410 directly underlying node 814.

In the case of some of the RC nodes 822, 824, at least one or more of the substrate mesh nodes have different in-plane coordinates from any of the RC nodes, and do not directly underlie any RC node. In some embodiments, all of the substrate mesh nodes have different in-plane coordinates from any of the RC nodes, and none directly underlies any RC node. FIG. 8B shows how one or more nodes 822, 824 of the RC extraction model 400 are connected to the same node 414 of the substrate mesh 410. The netlist identifying the RC nodes output by the RC extraction tool 310 is modified, so that the capacitor 823 (connected to RC node 822) and the capacitor 825 (connected to RC node 824) both have their bottom ends connected to the same node 414 of the substrate mesh. Thus, the RC extraction output nodes and the substrate mesh can be joined regardless of whether the number of substrate mesh nodes is different from the number of RC extraction model nodes.

In some embodiments, some or all of the substrate mesh model nodes are offset from (i.e., do not directly underlie) the RC nodes, and each RC node is connected to the nearest nodes in the top face of the substrate mesh model (based on Euclidean distance). In some embodiments, there are fewer nodes in the top face of the substrate mesh model than the number of RC nodes, and each RC node is connected to the nearest nodes in the top face of the substrate mesh model (based on Euclidean distance). Using distance to determine to which substrate mesh node each RC node is connected provides a computationally simple criterion.

Although not shown in FIG. 8B, in some embodiments, two nodes of the substrate mesh model are connected to a single RC node from the RC extraction outputs. In general, it is advantageous to have a number of nodes in the top face of the interposer substrate mesh model that is fewer than the number of RC nodes in the RC extraction outputs, in order to reduce computation time. However, even if the number of substrate mesh model nodes is fewer, it may be useful to connect a particular pair of substrate mesh model nodes to the same RC node (for example, in a region of low RC node density).

Because there is no requirement for a one-to-one correspondence between the RC nodes (FIG. 4A) and the nodes in the top face of the interposer substrate mesh model (FIG. 4B), the nodes may be joined in a manner which will balance accuracy and computation time.

In general, the accuracy of the substrate mesh model 410 is better when the number of nodes in the substrate mesh model is larger. The computation time is generally better if the nodes of the number of nodes in the substrate mesh model 410 is smaller.

Figure 8C:
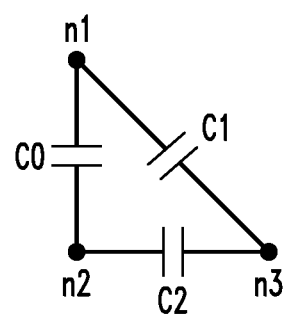
FIG. 8C is a diagram of a calculation to combine nodes to improve run time.

FIG. 8C shows a technique to improve runtime speed. Multiple metal RC-nodes can be connected to a single substrate mesh node or vice versa. For example, in FIG. 8C, the original capacitance value C0 from the RC extraction-tool is computed assuming the mesh RC-node n1 connects with a node n2 directly under it. Meanwhile, the substrate mesh model provides a node n3 at a another location offset from n2. The substrate RC extraction model provides the capacitance C2 between n2 and mesh node n3 which is offset from n2. To connect n1 to node n3. the capacitance value C1 between n1 and n3 is computed.

Figure 9:
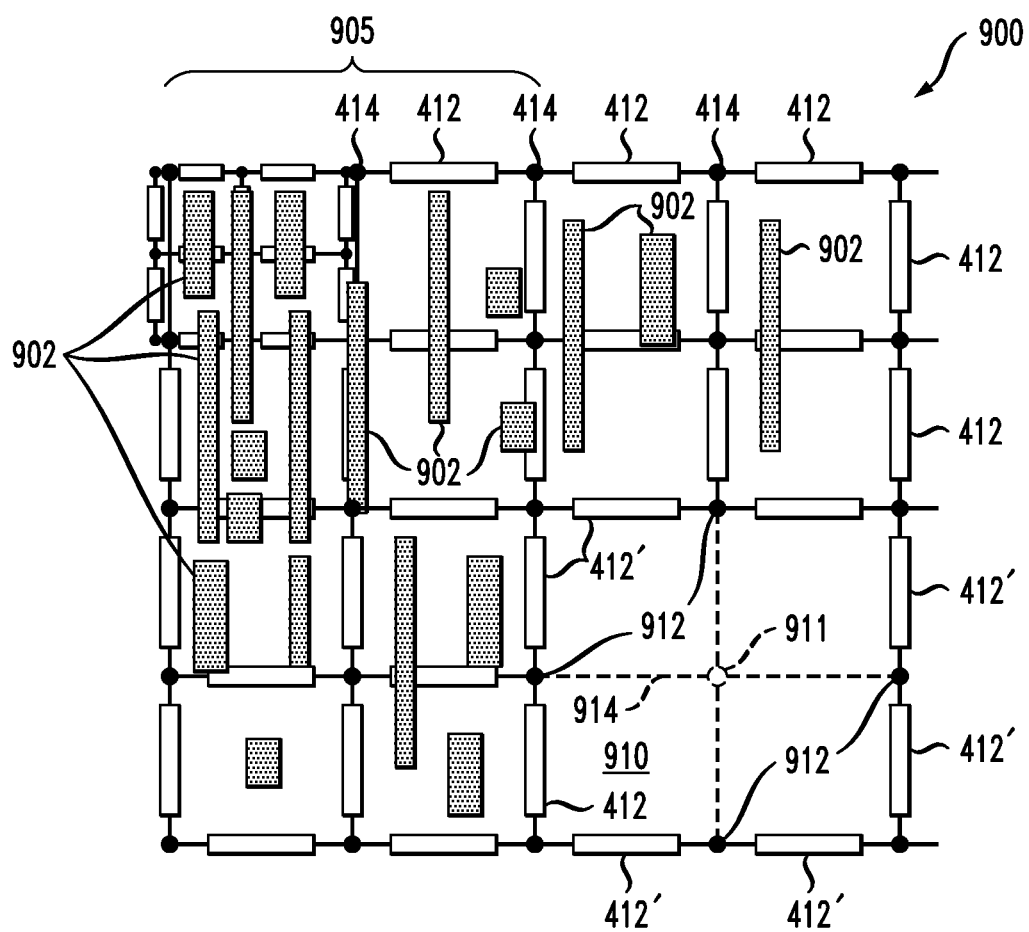
FIG. 9 is a diagram showing a model having two regions with different node densities.

FIG. 9 shows an embodiment of a model 900 having a first region 905 in which the conductive metal patterns 902 of the front 112 and/or back 114 interconnect layers of the silicon interposer 108 have a first density, and a second region 910 in which the metal patterns 902 have a second density lower than the first density. Thus, the corresponding substrate mesh model has a first portion 905 with a first node density, and a second portion 910 with a second node density lower than the first node density. The first portion 905 of the substrate mesh model substantially coincides with the first (higher node density) portion 905 of the semiconductor interposer 108. The second (lower density) portion 910 of the substrate mesh model substantially coincides with the second portion of the semiconductor interposer 108.

In some embodiments, the nodes of the substrate mesh model 900 are arranged on a rectangular grid, and the step of generating a substrate mesh model includes: generating a preliminary model having a uniform density of nodes 414; and deleting from the preliminary model a first node 911 (shown in phantom) of the substrate mesh, such that the plurality of RC nodes (corresponding to patterns 902) has no node in the location of the first node 911. In some embodiments, the model has no impedance elements connecting the nodes 912 to each other (as indicated by the dashed lines). If a node 911 and its impedance elements 914 are deleted from the model, the RC or RLC parameters for the surrounding impedance elements 412' are updated. For example, in the example of FIG. 9, the impedance elements 412' surrounding the location of the deleted node 911 will have a resistance value Rsub that is less than the resistance value of the other impedance elements 412.

In some embodiments, the nodes of the substrate mesh model 900 are arranged on a rectangular grid, and a preliminary model having a uniform node density is generated. At least a first node 911 (shown in phantom) is deleted from the preliminary model, such that four rectangles 914 (having sides shown in phantom) defined by the first node and additional nodes 912 adjacent to the first node do not underlie any front side conductive pattern of the semiconductor interposer. In other embodiments, any substrate mesh node 911 on the front or back face of the substrate mesh model, that is not within a threshold distance of any of the RC nodes corresponding to patterns 902 is deleted, and no impedance elements are placed at the location of the deleted node 911.

Figure 10:
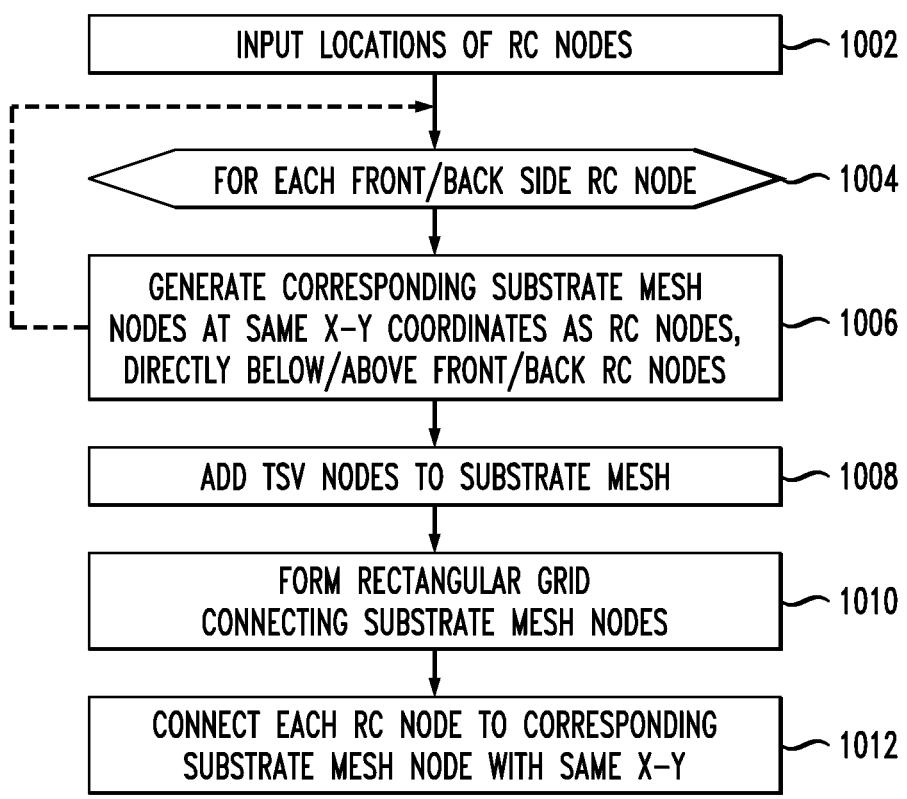
FIG. 10 is a flow chart of a process performed by the substrate mesh generation/insertion block of FIG. 3.

FIG. 10 is a flow chart of a first example of a process performed by the substrate mesh generation/insertion block 312. In some embodiments, block 312 is a special purpose computer formed by loading computer program code for executing the process of FIG. 10 into a tangible, machine readable storage medium accessible by a processor.

At step 1002, the locations of the RC nodes 404, 406 are input from the outputs of the RC extraction tool 310.

At step 1004, a loop is performed for each RC node.

At step 1006, in one embodiment, the substrate mesh nodes 414 corresponding to the RC nodes are generated at the same X-Y coordinates as the RC nodes, directly below the front face nodes 404, or directly above the back face nodes 406. (In other embodiments, the substrate mesh nodes can be created independently of the location and grid pitch of the RC-nodes, as discussed below).

At step 1008, additional nodes representing the TSVs are added to the substrate mesh.

At step 1010, a rectangular grid 410 is formed connecting the substrate mesh nodes 414. Impedance elements 412 are generated between adjacent nodes. The resistance Rsub and capacitance Csub of the impedance element 412 can be determined based on the interposer substrate material, the frequency of interest, and the distance between the nodes in the substrate mesh model. The values to be used for a given interposer material can initially be determined through silicon testing at several frequencies, and calibration of a substrate mesh model against the silicon data. For example, tests in a frequency band up to 2.5 GHz may be performed in silicon for calibrating the substrate mesh model at a variety of frequencies.

At step 1012, each RC node is connected to the corresponding substrate mesh node with the same X-Y coordinates.

The process of FIG. 10 automatically adjusts the density of the substrate mesh model to vary approximately with the density of the RC extraction nodes. This model can be used to emphasize accuracy.

Figure 11:
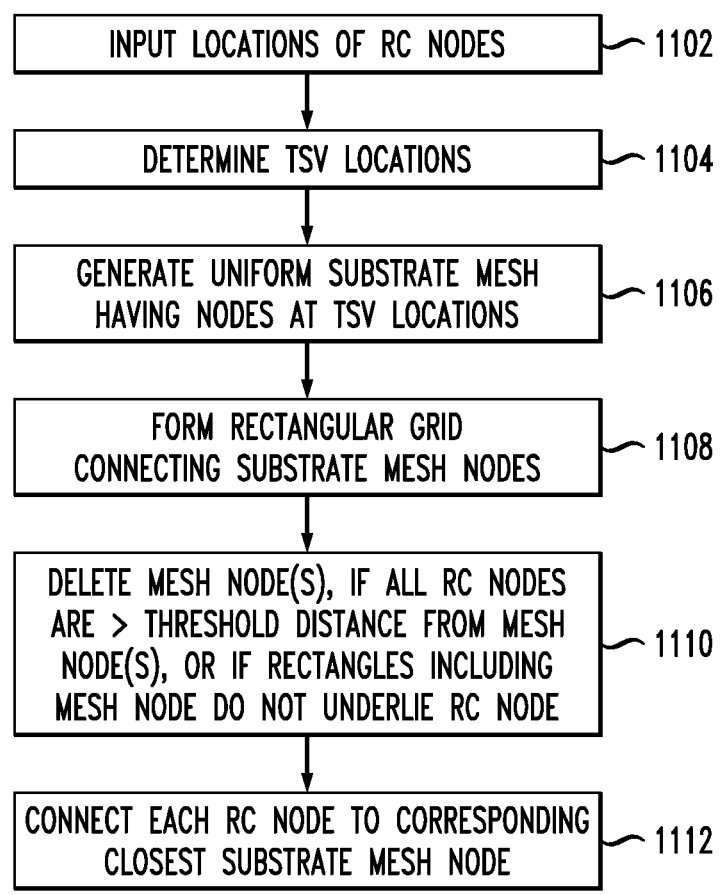
FIG. 11 is a flow chart of an alternative process performed by the substrate mesh generation/insertion block of FIG. 3.

FIG. 11 is a process performed by an alternative design of the substrate mesh generation/insertion block 312.

At step 1102, the locations of the RC nodes 404, 406 are input from the outputs of the RC extraction tool 310.

At step 1104, the locations of the TSVs are determined.

At step 1106, a uniform substrate mesh is generated. In one embodiment, the uniform substrate mesh has nodes at TSV locations. Thus, the granularity of the substrate mesh model can be determined by the TSV spacing, as an alternative to using the granularity of the RC node spacing. Also, the number of nodes between adjacent TSVs can be adjusted, to reduce simulation run time. In other embodiments, the TSV locations are offset from the nodes of the substrate mesh, such as the configuration shown in FIG. 7B.

At step 1108, a rectangular grid 410 is formed connecting the substrate mesh nodes 414. Impedance elements 412 are generated between adjacent nodes.

At step 1110, the density of the substrate mesh can optionally be reduced in areas where the RC node density is smaller, to improve simulation run time. This can be accomplished by, for example, deleting any substrate mesh node 414 if all of the RC nodes 404, 406 are more than a threshold distance from that substrate mesh node 414. Alternatively, a substrate mesh node 414 may be deleted if none of the rectangles formed by nodes including a given node underlie an RC node. If a node is deleted from the model, then the impedance elements 412 connected to that node are also deleted from the model. The remaining impedance elements immediately surrounding the location of the deleted node may be adjusted to reflect the different length of semiconductor material represented by that impedance element.

At step 1112, each RC node is connected to the corresponding closest substrate mesh node 414.

The methods described herein permit modeling of the frequency dependent effects of the silicon interposer, using existing EDA tools and formats, and the use of standard technology files In some embodiments, a method comprise analyzing front side conductive patterns and back side conductive patterns on a semiconductor interposer using a machine implemented RC extraction tool, and outputting data representing a plurality of respective RC nodes from the RC extraction tool to a tangible persistent machine readable storage medium. A substrate mesh model of the semiconductor interposer is generated, having a plurality of substrate mesh nodes. Each substrate mesh node is connected to adjacent ones of the plurality of substrate mesh nodes by respective substrate impedance elements. A set of inputs to a timing analysis tool is formed. The plurality of RC nodes are connected to ones of the plurality of substrate mesh nodes of the substrate mesh model. The set of inputs is stored in a tangible machine readable storage medium.

In some embodiments, a system comprises a processor-implemented RC extraction tool for analyzing front side conductive patterns and back side conductive patterns on a semiconductor interposer, and outputting data representing a plurality of respective RC nodes. A processor-implemented substrate extraction tool is provided for generating a substrate mesh model of the semiconductor interposer having a plurality of substrate mesh nodes. Each substrate mesh node is connected to adjacent ones of the plurality of substrate mesh nodes by respective substrate impedance elements. A tangible persistent machine readable storage medium stores a set of inputs to a timing analysis tool. The plurality of RC nodes are connected to ones of the plurality of substrate mesh nodes of the substrate mesh model.

In some embodiments, a tangible persistent machine readable storage medium has machine readable program instructions encoded therein. The program instructions are executed by a processor. The processor analyzes front side conductive patterns and back side conductive patterns on a semiconductor interposer using a machine implemented RC extraction tool, and outputs data representing a plurality of respective RC nodes from the RC extraction tool. The processor generates a substrate mesh model of the semiconductor interposer having a plurality of substrate mesh nodes. Each substrate mesh node is connected to adjacent ones of the plurality of substrate mesh nodes by respective substrate impedance elements. The processor forms a set of inputs to a timing analysis tool. The plurality of RC nodes are connected to ones of the plurality of substrate mesh nodes of the substrate mesh model. A tangible machine readable storage medium stores the set of inputs.

The methods described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, when the computer program code is loaded into and executed by a computer, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
    analyzing front side conductive patterns and back side conductive patterns on a semiconductor interposer using a machine implemented RC extraction tool, and outputting data representing a plurality of respective RC nodes from the RC extraction tool to a tangible persistent machine readable storage medium;
    generating a substrate mesh model of the semiconductor interposer having a plurality of substrate mesh nodes, wherein each substrate mesh node is connected to adjacent ones of the plurality of substrate mesh nodes by respective substrate impedance elements, wherein the interposer has at least one through-substrate via (TSV) extending from the front side of the interposer to the back side of the interposer, the TSV is located at one of the substrate mesh nodes, and the substrate impedance elements adjacent to the TSV have different resistance and capacitance values than other ones of the plurality of substrate impedance elements that are not adjacent to the TSV;
    forming a set of inputs to a timing analysis tool, wherein the plurality of RC nodes are connected to ones of the plurality of substrate mesh nodes of the substrate mesh model; and
    storing the set of inputs in a tangible machine readable storage medium.

2. The method of claim 1, further comprising:
    performing a timing analysis of the semiconductor interposer using a machine implemented timing analysis tool and the set of inputs, so as to simulate frequency dependent capacitive couplings between the front side conductive patterns and backside conductive patterns.

3. The method of claim 1, wherein the nodes and the substrate impedance elements of the substrate mesh model are arranged on a three-dimensional rectangular grid having three orthogonal axes, such that each substrate impedance element is located between two adjacent ones of the nodes.

4. The method of claim 1, wherein each substrate impedance element includes a resistance and a capacitance in parallel to each other.

5. The method of claim 4, wherein each substrate impedance element further includes an inductance in parallel with the capacitance.

6. The method of claim 1, wherein
    the substrate mesh model is generated to include a respective substrate mesh node adjacent to each respective RC node, and
    the step of forming the set of inputs includes connecting each RC node to its respective substrate mesh node.

7. The method of claim 6, wherein the step of generating the substrate mesh model includes:
    generating a respective substrate mesh node having the same in-plane coordinates as, and directly underlying, each respective RC node.

8. The method of claim 1, wherein
    the substrate mesh model is generated to include a respective substrate mesh node adjacent to each respective RC node, and
    the step of forming the set of inputs includes connecting each RC node to the substrate mesh node closest to that RC node, based on Euclidean distance.

9. The method of claim 8, wherein at least two of the RC nodes are connected to the same one of the substrate mesh nodes.

10. The method of claim 1, wherein the substrate mesh model has a first portion with a first node density, and a second portion with a second node density lower than the first node density.

11. The method of claim 10, wherein:
    the semiconductor interposer has a first portion, in which one of the group consisting of the front side conductive patterns and the back side conductive patterns have a first density, and a second portion, in which the one of the front side conductive patterns and the back side conductive patterns have a second density lower than the first density, and
    the second portion of the substrate mesh model substantially coincides with the second portion of the semiconductor interposer.

12. The method of claim 11, wherein the nodes of the substrate mesh model are arranged on a rectangular grid, and the step of generating a substrate mesh model includes:
    generating a preliminary model having a uniform node density; and
    deleting from the preliminary model a first node of the substrate mesh, such that all of the plurality of RC nodes is more than a threshold distance from the location of the first node.

13. The method of claim 11, wherein the nodes of the substrate mesh model are arranged on a rectangular grid, and the step of generating a substrate mesh model includes:
    generating a preliminary model having a uniform node density; and
    deleting from the preliminary model a first node, such that four rectangles defined by the first node and additional nodes adjacent to the first node do not underlie any front side conductive pattern of the semiconductor interposer.

14. The method of claim 1, further comprising
    performing a timing analysis of the semiconductor interposer using a machine implemented timing analysis tool and the set of inputs, so as to simulate frequency dependent capacitive couplings between the front side conductive patterns and backside conductive patterns; and
    fabricating the semiconductor interposer if the timing analysis indicates that a design of the semiconductor interposer satisfies a predetermined timing specification; and
    incorporating the semiconductor interposer into a 2.5D package.

15. A system comprising:
    a processor-implemented RC extraction tool for analyzing front side conductive patterns and back side conductive patterns on a semiconductor interposer, and outputting data representing a plurality of respective RC nodes;
    a processor-implemented substrate extraction tool for generating a substrate mesh model of the semiconductor interposer having a plurality of substrate mesh nodes, wherein each substrate mesh node is connected to adjacent ones of the plurality of substrate mesh nodes by respective substrate impedance elements, wherein the interposer has at least one through-substrate via (TSV)

extending from the front side of the interposer to the back side of the interposer, the TSV is located at one of the substrate mesh nodes, and the substrate impedance elements adjacent to the TSV have different resistance and capacitance values than other ones of the plurality of substrate impedance elements that are not adjacent to the TSV; and a tangible persistent machine readable storage medium for storing a set of inputs to a timing analysis tool, wherein the plurality of RC nodes are connected to ones of the plurality of substrate mesh nodes of the substrate mesh model.

16. The system of claim 15, further comprising:
a machine implemented timing analysis tool for performing a timing analysis of the semiconductor interposer using the set of inputs, so as to simulate frequency dependent capacitive couplings between the front side conductive patterns and backside conductive patterns.

17. The system of claim 16, wherein:
the nodes and the substrate impedance elements of the substrate mesh model are arranged on a three-dimensional rectangular grid having three orthogonal axes, such that each substrate impedance element is located between two adjacent ones of the nodes, each substrate impedance element including a resistance and a capacitance in parallel to each other;
the substrate mesh model is generated to include a respective substrate mesh node adjacent to each respective RC node,
the step of forming the set of inputs includes connecting each RC node to its respective substrate mesh node; and
the step of generating the substrate mesh model includes generating a respective substrate mesh node having the same in-plane coordinates as, and directly underlying, each respective RC node.

18. A tangible persistent machine readable storage medium having machine readable program instructions encoded therein, such that when the program instructions are executed by a processor, the processor performs a method comprising:

analyzing front side conductive patterns and back side conductive patterns on a semiconductor interposer using a machine implemented RC extraction tool, and outputting data representing a plurality of respective RC nodes from the RC extraction tool;

generating a substrate mesh model of the semiconductor interposer having a plurality of substrate mesh nodes, wherein each substrate mesh node is connected to adjacent ones of the plurality of substrate mesh nodes by respective substrate impedance elements, wherein the interposer has at least one through-substrate via (TSV) extending from the front side of the interposer to the back side of the interposer, the TSV is located at one of the substrate mesh nodes, and the substrate impedance elements adjacent to the TSV have different resistance and capacitance values than other ones of the plurality of substrate impedance elements that are not adjacent to the TSV;

forming a set of inputs to a timing analysis tool, wherein the plurality of RC nodes are connected to ones of the plurality of substrate mesh nodes of the substrate mesh model; and storing the set of inputs in a tangible machine readable storage medium.

19. The storage medium of claim 18, wherein the method further comprises:
performing a timing analysis of the semiconductor interposer using a machine implemented timing analysis tool and the set of inputs, so as to simulate frequency dependent capacitive couplings between the front side conductive patterns and backside conductive patterns.

20. The storage medium of claim 18, wherein the nodes and the substrate impedance elements of the substrate mesh model are arranged on a three-dimensional rectangular grid having three orthogonal axes, such that each substrate impedance element is located between two adjacent ones of the nodes.

* * * * *